(12) United States Patent
Wiesbauer et al.

(10) Patent No.: US 8,077,856 B2
(45) Date of Patent: Dec. 13, 2011

(54) DRIVER CIRCUIT AND METHOD FOR DRIVING A SIGNAL

(75) Inventors: Andreas Wiesbauer, Portschach (AT); Sergio Walter, Villach (AT); Alexander Kahl, Landskron (AT); David San Segundo Bello, Villach (AT)

(73) Assignee: Lantiq Deutschland GmbH, Neubiberg (DE)

( * ) Notice: Subject to any disclaimer, the term of this patent is extended or adjusted under 35 U.S.C. 154(b) by 1568 days.

(21) Appl. No.: 11/474,636

(22) Filed: Jun. 26, 2006

(65) Prior Publication Data

US 2007/0018721 A1    Jan. 25, 2007

(30) Foreign Application Priority Data

Jun. 27, 2005   (DE) .................. 10 2005 030 049

(51) Int. Cl.
*H04M 1/00* (2006.01)
(52) U.S. Cl. ......... 379/403; 379/395; 379/405; 379/413
(58) Field of Classification Search . 379/399.01–413.04
See application file for complete search history.

(56) References Cited

U.S. PATENT DOCUMENTS

2002/0034294 A1* 3/2002 Servaes et al. .......... 379/399.01
2010/0104089 A1* 4/2010 Hauptmann et al. .......... 379/395

FOREIGN PATENT DOCUMENTS

| EP | 1560412 | * | 3/2005 |
| EP | 1 560 412 A1 | | 8/2005 |
| EP | 1560412 A1 | * | 8/2005 |

OTHER PUBLICATIONS

German Office Action dated Mar. 6, 2006.

* cited by examiner

*Primary Examiner* — Fan Tsang
*Assistant Examiner* — Ibraham Sharifzada
(74) *Attorney, Agent, or Firm* — SpryIP, LLC

(57) ABSTRACT

Driver circuit for driving a transmit signal for a line comprising a signal amplifier which delivers a transmit signal, present at a signal input of the signal amplifier, amplified with a gain to a signal output, a line interface circuit which is connected between the signal output of the signal amplifier and the line, and comprising a hybrid circuit which is connected to the line interface circuit, wherein the hybrid circuit suppresses the transmit signal and couples a received signal received via the line to a signal input of the signal amplifier for the purpose of impedance synthesis.

21 Claims, 11 Drawing Sheets

DRIVER CIRCUIT AND METHOD FOR DRIVING A SIGNAL

The invention relates to a circuit and to a method for driving a transmit signal which, in particular, can be used in transceivers.

FIG. 1 shows a conventional driver circuit for driving a transmit signal. The driver circuit contains an inverting amplifier, the signal output of which is fed back via a resistor $R_{fb}$. The signal amplifier amplifies the transmit signal present at the signal input with a particular gain and delivers the amplified transmit signal via its signal output to a transformer connected thereto. The transformer couples the amplified transmit signal present at its primary winding into its secondary winding which is connected, in turn, to a twisted two-wire telephone line. The transformer is connected to a reference voltage potential via an external terminating impedance. The transformer is also fed back to the input via a feedback loop containing a synthesis resistor $R_{syn}$ for generating a synthesized output impedance.

In the driver circuit shown in FIG. 1, the signal output of the signal amplifier is directly connected to the transformer.

From the point of view of the telephone line, the output impedance is:

$$Z_{Line} = n^2 (Z_{cosyn} + Z_{coEXT}),$$

where the actively synthesized impedance $Z_{cosyn}$ is dependent on the synthesis resistor $R_{syn}$ and the feedback resistor $R_{fb}$:

$$Z_{cosyn} = Z_{coEXT} \left( \frac{R_{fb}}{R_{syn}} \right)$$

The gain of the driver circuit according to the prior art, shown in FIG. 1, is $$G_{tx} = \frac{U_{tx}}{U_{in}} = -\frac{\frac{1}{R_{in}}}{\frac{1}{R_{fb}} + \frac{1}{R_{syn}} \cdot \frac{Z_t}{Z_t + Z_L}},$$

Where $Z_L$ is the impedance of the transformer as seen from the signal amplifier and wherein $Z_t$ is equal to the external terminating impedance $Z_{coEXT}$.

If a class-D signal amplifier is used as signal amplifier which supplies an amplified pulse-width-modulated signal, an analogue low-pass filter is usually provided between the signal amplifier output and the transformer in order to filter out a high-frequency switching noise of the amplified transmit signal, produced during the amplification by the class-D signal amplifier. This low-pass filter is also called an OOB (out of band) filter.

FIG. 2 shows a conventional driver circuit for driving a transmit signal which contains such an OOB filter. The out-of-band low-pass filter has a particular transfer function $H_{COS}$ in order to meet the spectral power density requirements PSD of the transmission standard.

In the driver circuit shown in FIG. 2, the impedance, as seen from the telephone line, is also:

$$Z_{Line} = n^2 (Z_{cosyn} + Z_{coEXT}),$$

where the synthesized impedance is dependent on the transfer function $H_{COS}$ of the low-pass filter:

$$Z_{cosyn} = Z_{coEXT} \left( H_{oob} \cdot \frac{R_{fb}}{R_{syn}} \right)$$

The gain of the driver circuit is obtained as:

$$G_{tx} = \frac{U_{tx}}{U_{in}} = \frac{\frac{1}{R_{in}}}{\frac{1}{R_{fb}} + \frac{1}{R_{syn}} \cdot H_{oob} \cdot \frac{Z_t}{Z_t + Z_c}}$$

The driver circuit as shown in FIG. 2 has the disadvantage that the gain $G_{tx}$ is dependent on the transfer function $H_{COS}$ of the analogue low-pass filter. The stability of the feedback loop for the impedance synthesis is thus dependent on the transfer characteristics of the OOB filter so that unstable feedback can occur.

The invention creates a driver circuit for driving a transmit signal for a line comprising a signal amplifier which delivers a transmit signal, present at a signal input of the signal amplifier, amplified with a gain at a signal output, a line interface circuit which is connected between the signal output of the signal amplifier and the line, and comprising a hybrid circuit which is connected to the line interface circuit, the hybrid circuit suppressing the transmit signal and coupling a received signal received via the line to a signal input of the signal amplifier for the purpose of impedance synthesis.

The invention also creates a driver circuit for driving a transmit signal for a line comprising
a signal amplifier which delivers a transmit signal, present at a signal input of the signal amplifier, amplified with a gain at a signal output, a transformer, the secondary winding of which is connected to the line and the primary winding of which has a first terminal which is connected to the signal output of the signal amplifier and a second terminal which is connected to a terminating impedance, and comprising
at least one hybrid circuit which has a first feedback impedance which feeds back the first connection of the primary winding to the signal input of the signal amplifier and which has a second feedback impedance which feeds back the second connection of the primary winding to the signal input of the signal amplifier.

In one embodiment of the driver circuit according to the invention, the hybrid circuit couples a received signal received via the line.

In one embodiment of the driver circuit according to the invention, the received signal coupled out by the hybrid circuit is added to the transmit signal at a summation node for the purpose of impedance synthesis.

In a further embodiment of the driver circuit according to the invention, the synthesized impedance can be adjusted independently of the gain of the signal amplifier.

In one embodiment of the driver circuit according to the invention, a filter for filtering high-frequency signal disturbances of the amplified transmit signal is provided between the signal amplifier and the transformer.

In a further embodiment of the driver circuit according to the invention, the ratio of impedance values of the two feedback impedances contained in the hybrid circuit is such that the gain is independent of a filter transfer function of the filter.

In one embodiment of the driver circuit according to the invention, the filter is an out-of-band filter.

In one embodiment of the driver circuit according to the invention, the signal amplifier is a class-D signal amplifier which delivers a pulse-width-modulated transmit signal.

In one embodiment of the driver circuit according to the invention, the filter is an analogue low-pass filter for filtering out a high-frequency switching noise of the pulse-width-modulated amplified transmit signal.

In one embodiment of the driver circuit according to the invention, the feedback impedances are formed by resistors.

In one embodiment of the driver circuit according to the invention, the feedback impedances are integrated in the signal amplifier.

In a preferred embodiment of the driver circuit according to the invention, the second feedback loop generates a synthesized line terminating impedance.

In one embodiment of the driver circuit according to the invention, it is of fully differential construction.

The invention also creates a hybrid circuit for a transceiver which couples out a received signal received via a line and adds it to a transmit signal of the transceiver at a summation node for the purpose of impedance synthesis of an output impedance of the transceiver.

The invention also creates a method for driving a transmit signal, in which a transmit signal is amplified and coupled into a line, wherein a received signal received via the line is coupled out and added to the transmit signal for the purpose of impedance synthesis.

In the text which follows, embodiments of the driver circuit according to the invention are described with reference to the attached figures, for explaining features essential to the invention.

Figure 3:
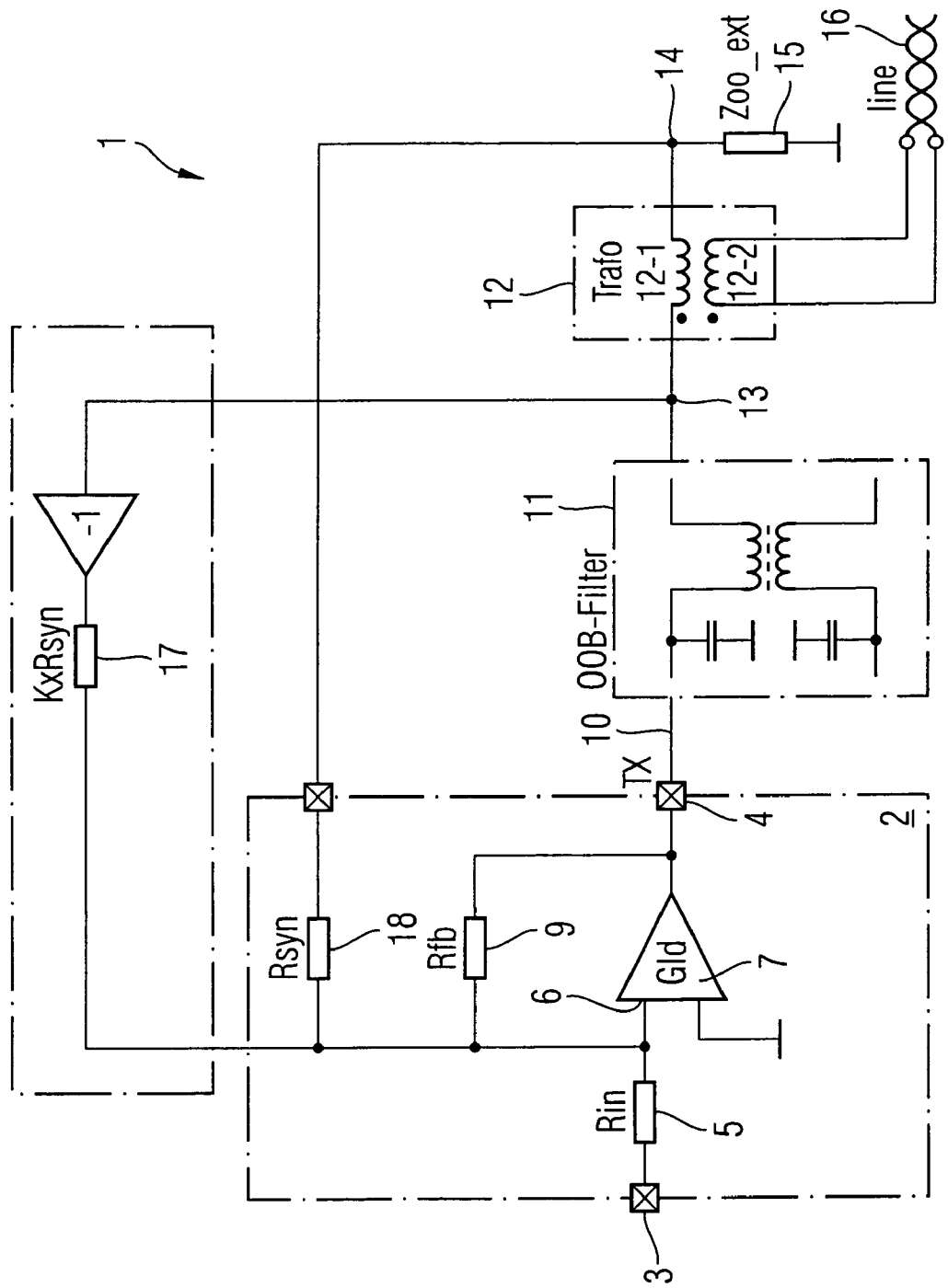
FIG. 3 shows a circuit diagram of a first embodiment of the driver circuit according to the invention for driving a transmit signal.

As can be seen from FIG. 3, the embodiment shown there contains a driver circuit 1 according to the invention for driving a transmit signal, a signal amplifier 2 with a signal input 3 and a signal output 4. In the embodiment shown in FIG. 3, the signal amplifier 2 is an inverting amplifier with an input resistor 5 which is connected to a first input 6 of the operational amplifier 7, the second input 8 of which is connected to a reference potential. At the signal output 4, the operational amplifier 7 is fed back to the first signal input 6 via a feedback resistor 9. The signal amplifier 2 amplifies the transmit signal present at the signal input 3 with a particular gain which delivers the amplified transmit signal at its signal output 4 via a line 10 to an OOB low-pass filter 11. The filter 11 has a particular transfer function $H_{OOB}$ and filters out high-frequency signal disturbances of the amplified transmit signal.

The driver circuit 1 also contains a transformer 12 with a primary winding 12-1 and a secondary winding 12-2. The primary winding 12-1 has a first terminal 13 and a second terminal 14. The first terminal 13 of the primary winding 12-1 of the transformer 12 is connected to the OOB filter 11. The second terminal 14 of the primary winding 12-1 is connected to a terminating impedance 15. At the secondary winding 12-2 of the transformer 12, a line 16, particularly a twisted two-wire telephone line 16, is connected.

The embodiment of the driver circuit 1 shown in FIG. 3 contains two feedback loops. The first feedback loop feeds the first connection 13 of the primary winding 12-1 back to the first signal input 6 of the operational amplifier 7 via a first feedback impedance 17. The signal fed back is preferably inverted as shown in FIG. 3.

In addition, the driver circuit 1 contains a second feedback loop which feeds the second connection 14 of the primary winding 12-1 back to the first signal input 8 of the operational amplifier 7 via a second feedback impedance 18. In the driver circuit 1 according to the invention, the ratio of the resistance values of the two feedback impedances 17, 18 is dimensioned in such a manner that the gain is independent of the filter transfer function of the OOB filter 11.

Figure 1:
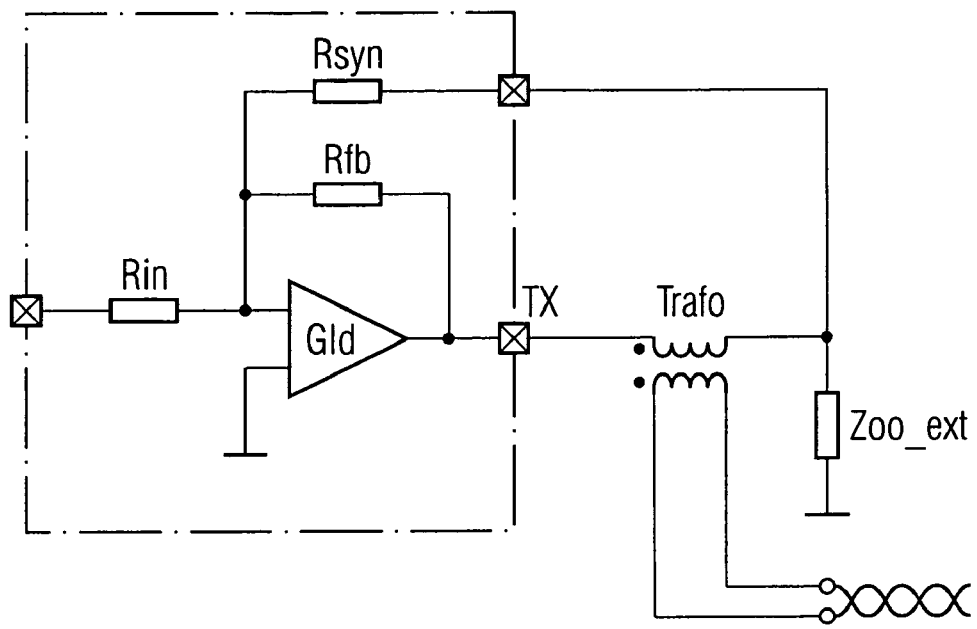
FIG. 1 shows a conventional driver circuit for driving a transmit signal.
Figure 2:
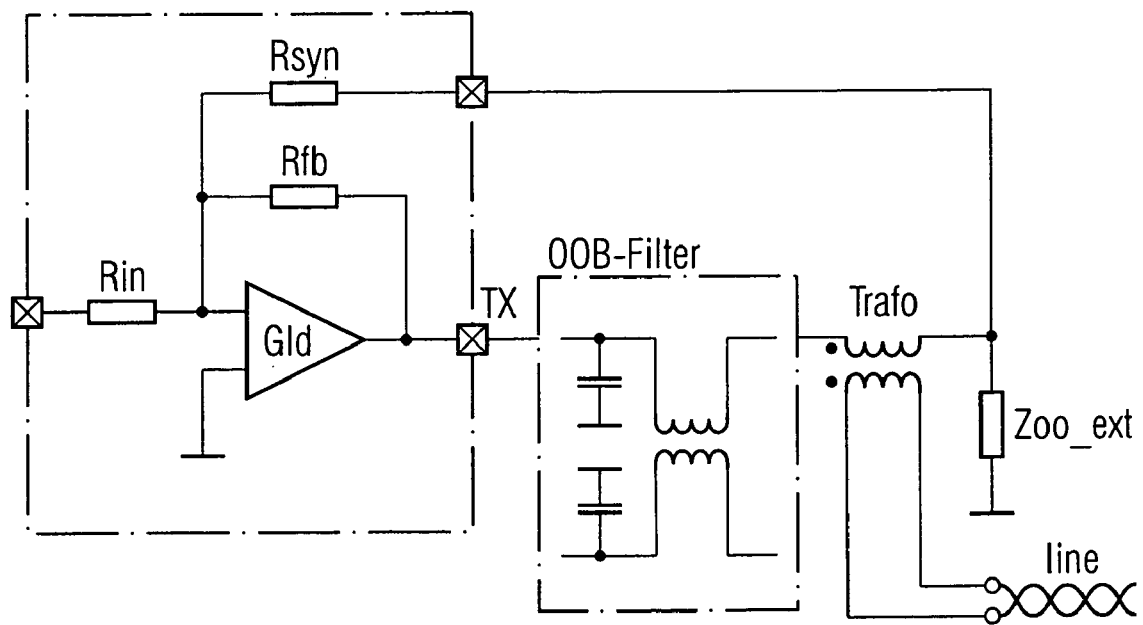
FIG. 2 shows a further conventional driver circuit with an OOB filter.

As can be seen by comparing FIG. 2, which shows a conventional driver circuit, and FIG. 3, which shows the driver circuit according to the invention, the driver circuit according to the invention has, apart from the usual feedback loop containing the synthesis impedance 18, an additional feedback loop which is formed by the feedback impedance 17. By providing this additional feedback loop or this additional feedback signal path, only the received signal is fed back for impedance synthesis so that the transmit signal gain is independent of the transfer characteristics of the OOB filter 11.

The signal amplifier 2 is preferably formed by a class-D signal amplifier which delivers an amplified pulse-width-modulator transmit signal to the OOB filter 11. The OOB filter is an analogue low-pass filter which filters out the high-frequency disturbances produced during the signal amplification or, respectively, the high-frequency switching noise of the pulse-width-modulated amplified transmit signal in order to ensure, in particular, the spectral power density of the transmit signal demanded by the standard.

The feedback impedances 17, 18 are preferably formed by resistors.

These feedback resistors are preferably integrated in the signal amplifier 2.

The output impedance, seen by the telephone line 16, of the driver circuit 1 according to the invention is:

$$Zline = n^2 \cdot (Zco\_syn + Zco\_ext),$$

where the actively synthesized impedance $Z_{cosyn}$ is obtained as follows:

$$Zco\_syn = Zco\_ext \cdot \left( \frac{\frac{1}{Rsyn}}{\frac{1}{Rfb \cdot Hoob} \frac{1}{k \cdot Rsyn}} \right) \approx Zco\_ext \cdot \left( Hoob \cdot \frac{Rfb}{Rsyn} \right),$$

Where $R_{syn}$ is the resistance value of the feedback impedance 18,
$k \cdot R_{syn}$ is the resistance value of the feedback impedance 17, $R_{fb}$ is the resistance value of the feedback resistor 9, and $Zco_{EXT}$ is the impedance of the external terminating impedance.

The gain is then obtained as follows:

$$Gtx = \frac{Utx}{Uin} = \frac{\frac{1}{Rin}}{\frac{1}{Rfb} + \frac{1}{Rsyn} \cdot Hoob \cdot \frac{Zt}{Zt+Zl} \cdot \left(1 - \frac{Zl+Zt}{Zt} \cdot \frac{1}{k}\right)}$$

if the ratio k between the resistance values of the two feedback impedances 17, 18 is selected in such a manner that $$\left(1 - \frac{Zl+Zt}{Zt} \cdot \frac{1}{k}\right) = 0$$

i.e.

$$k = \frac{Zl+Zt}{Zt}$$

then the gain G is independent of the transfer function $H_{OOB}$ of the filter 11:

$$Gtx = \frac{Utx}{Uin} = -\frac{Rfb}{Rin}.$$

In the embodiment of the driver circuit 1 as shown in FIG. 3, a change in the transfer function of the OOB filter 11 has no effect whatsoever on the gain of the transmit signal. This has the advantage that the OOB filter 11 can be designed independently of the signal amplifier 2. The impedance ratio is, for example about 7, the resistance value of the feedback impedance 18 being about 20 kΩ.

The external terminating impedance 15, shown in FIG. 3, can consist of a conventional resistor or of a complex switching network containing coils, capacitors and resistors.

Figure 4:
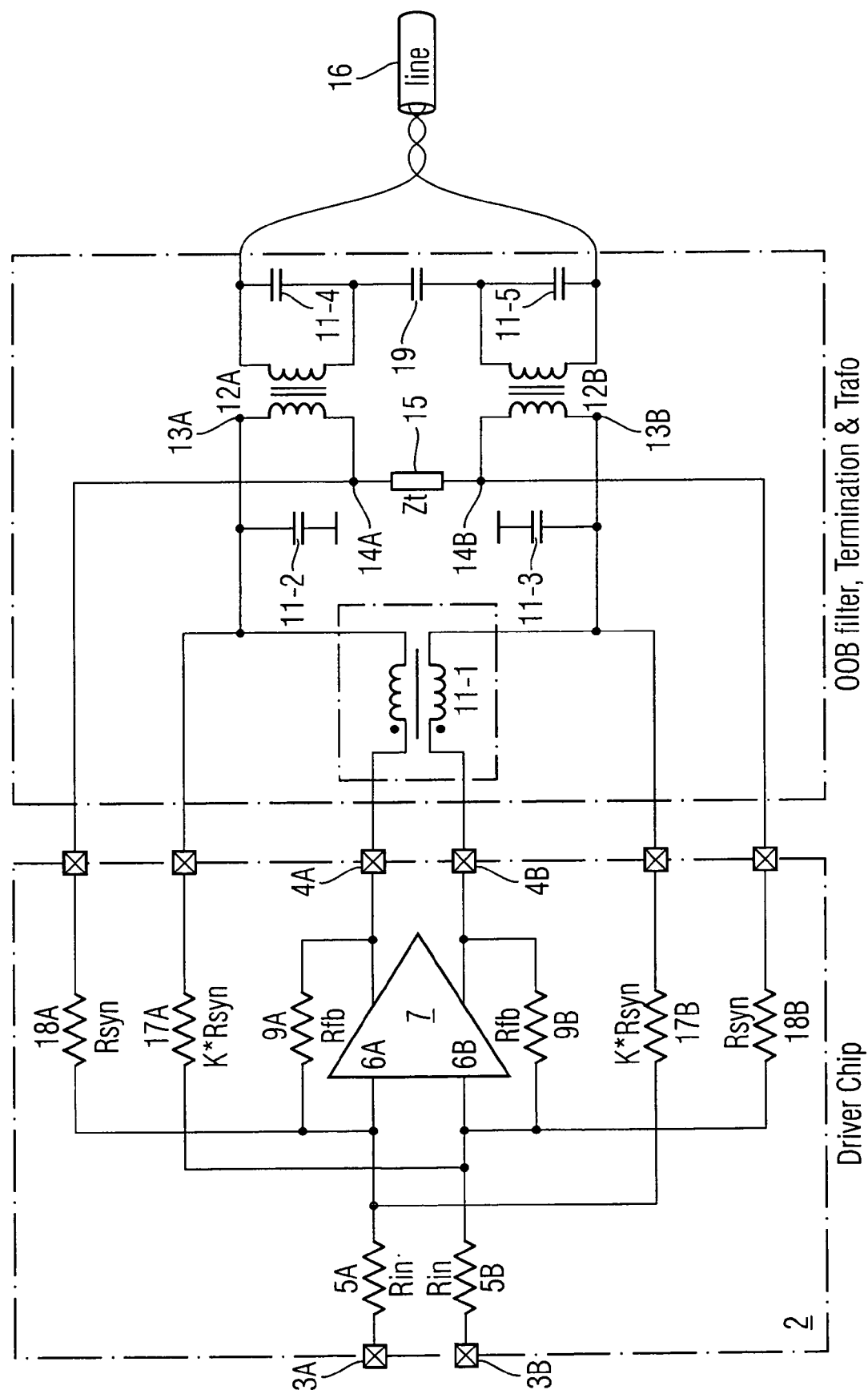
FIG. 4 shows a fully differential embodiment of the driver circuit according to the invention.

In one embodiment, the embodiment is of fully differential construction as is shown in FIG. 4.

In the fully differential embodiment according to FIG. 4, the OOB filter 11 is formed by an in-phase reactor 11-1 and by a number of capacitors 11-2, 11-3, 11-4, 11-5. In this arrangement, a first pair of capacitors 11-2, 11-3 is connected to the primary windings and a second pair of capacitors 11-4, 11-5 is connected to the secondary windings of the two transformers 12A, 12B. The secondary windings of the transformers 12A, 12B are also connected to one another via a capacitor 19.

Figure 5:
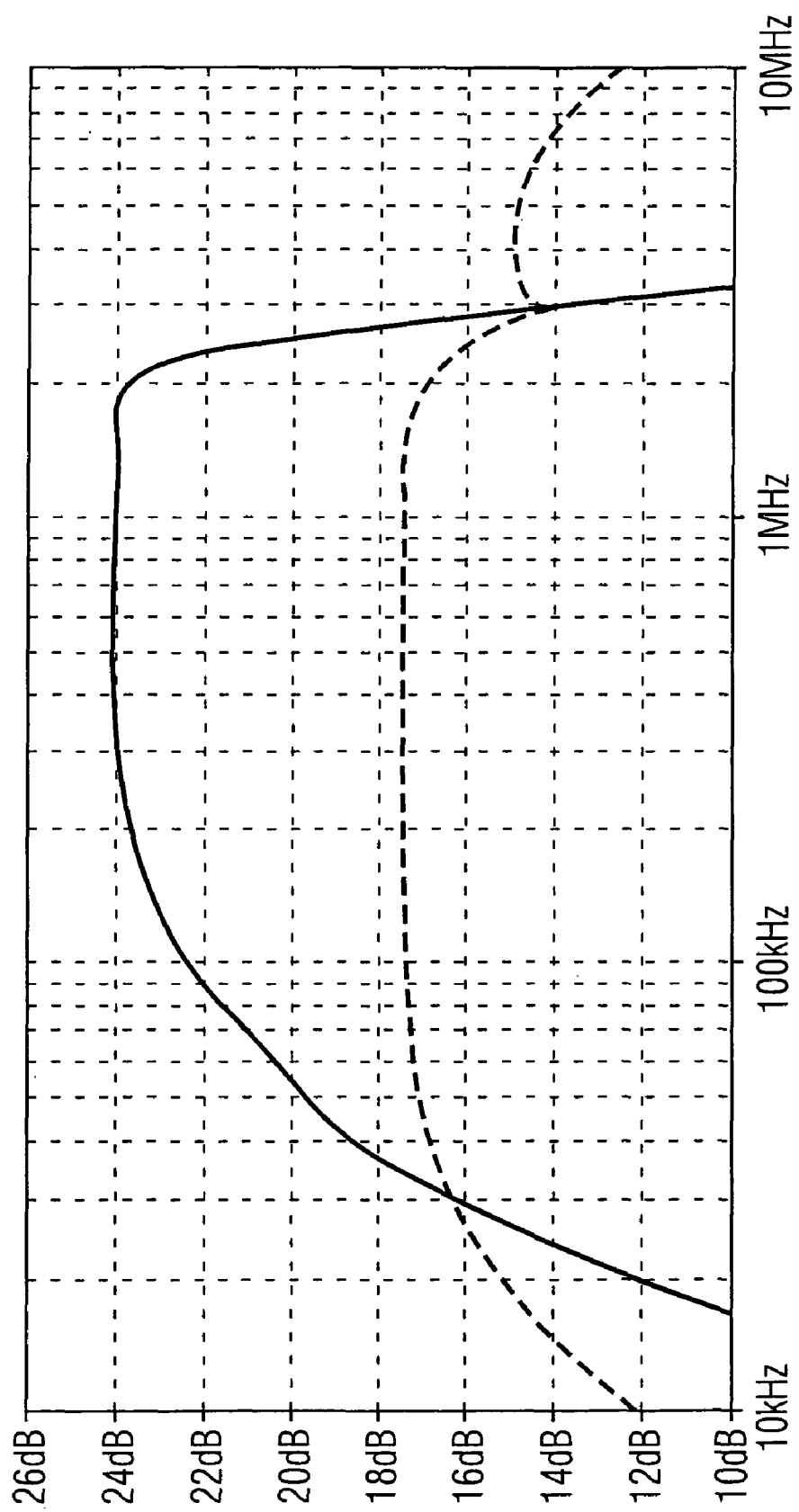
FIG. 5 shows transfer functions of a conventional driver circuit without impedance synthesis.

FIG. 5 shows transfer functions of conventional driver circuits without impedance synthesis. The upper line shows the transfer function between the driver input and the telephone line and the lower line shows the transfer function between the driver input and the driver output.

Figure 6:
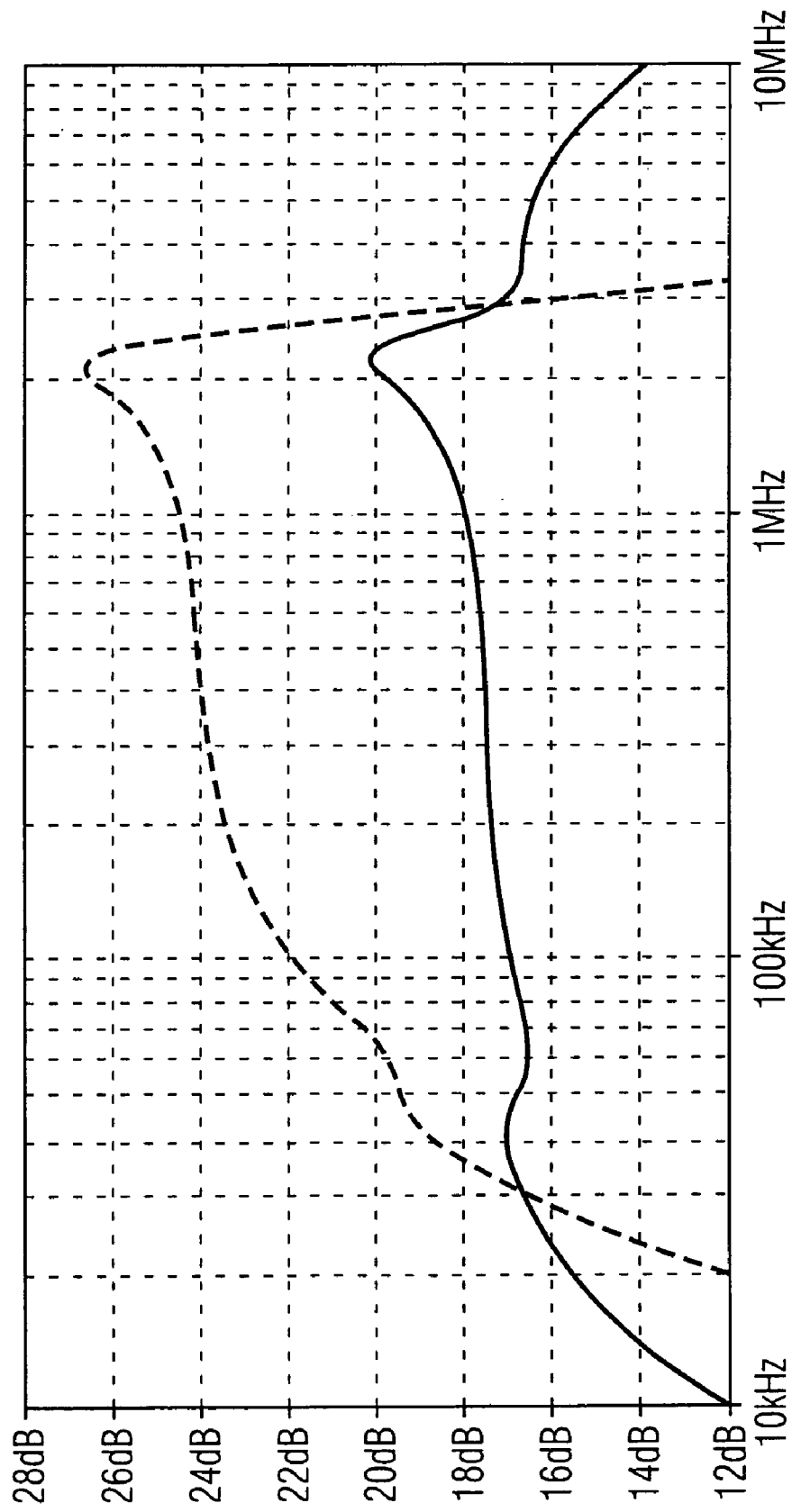
FIG. 6 shows transfer functions of a conventional driver circuit with impedance synthesis.

FIG. 6 shows transfer functions of conventional driver circuits with standard impedance synthesis. As can be seen from FIG. 6, the transfer functions have peaks at about 2 MHz which illustrate the impaired stability of the signal amplifier 1 due to the presence of the OOB filter.

Figure 7:
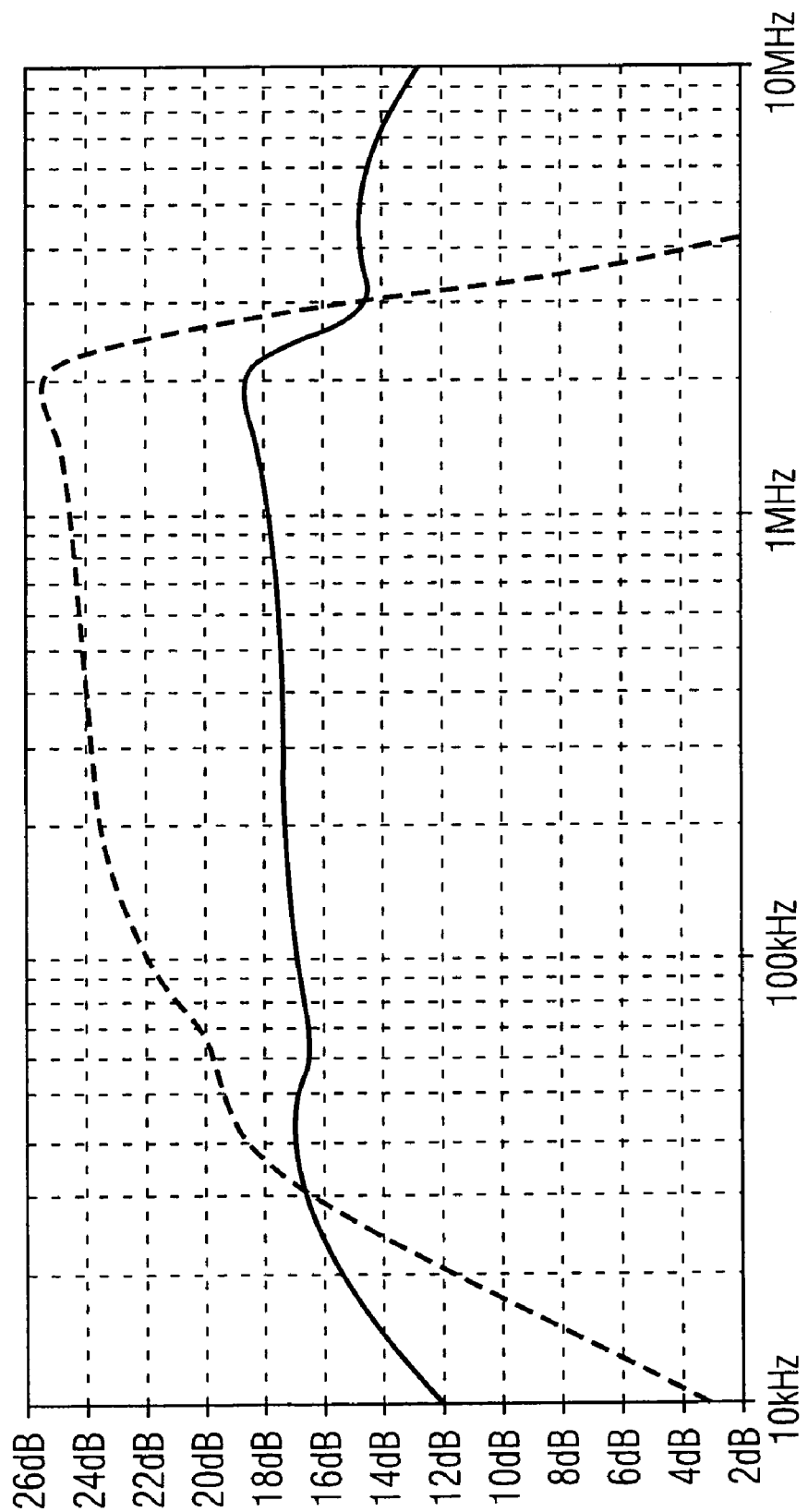
FIG. 7 shows transfer functions of a possible embodiment of a driver circuit according to the invention for driving a transmit signal.

FIG. 7 shows transfer functions of the driver circuit 1 as shown in FIGS. 3, 4. The upper line again shows transfer functions between the driver input 3 and the telephone line 16. The lower line shows the transfer function between the signal amplifier input 3 and the signal amplifier output 4. As can be seen clearly from FIG. 7, the transfer peaks in the driver circuit 1 are flattened distinctly in comparison with the variation shown in FIG. 6.

By providing an additional feedback loop, the driver circuit 1 thus achieves a situation where the gain is independent of the transfer characteristics of the OBB filter 11 and where no instabilities can occur in the feedback loop.

Figure 8:
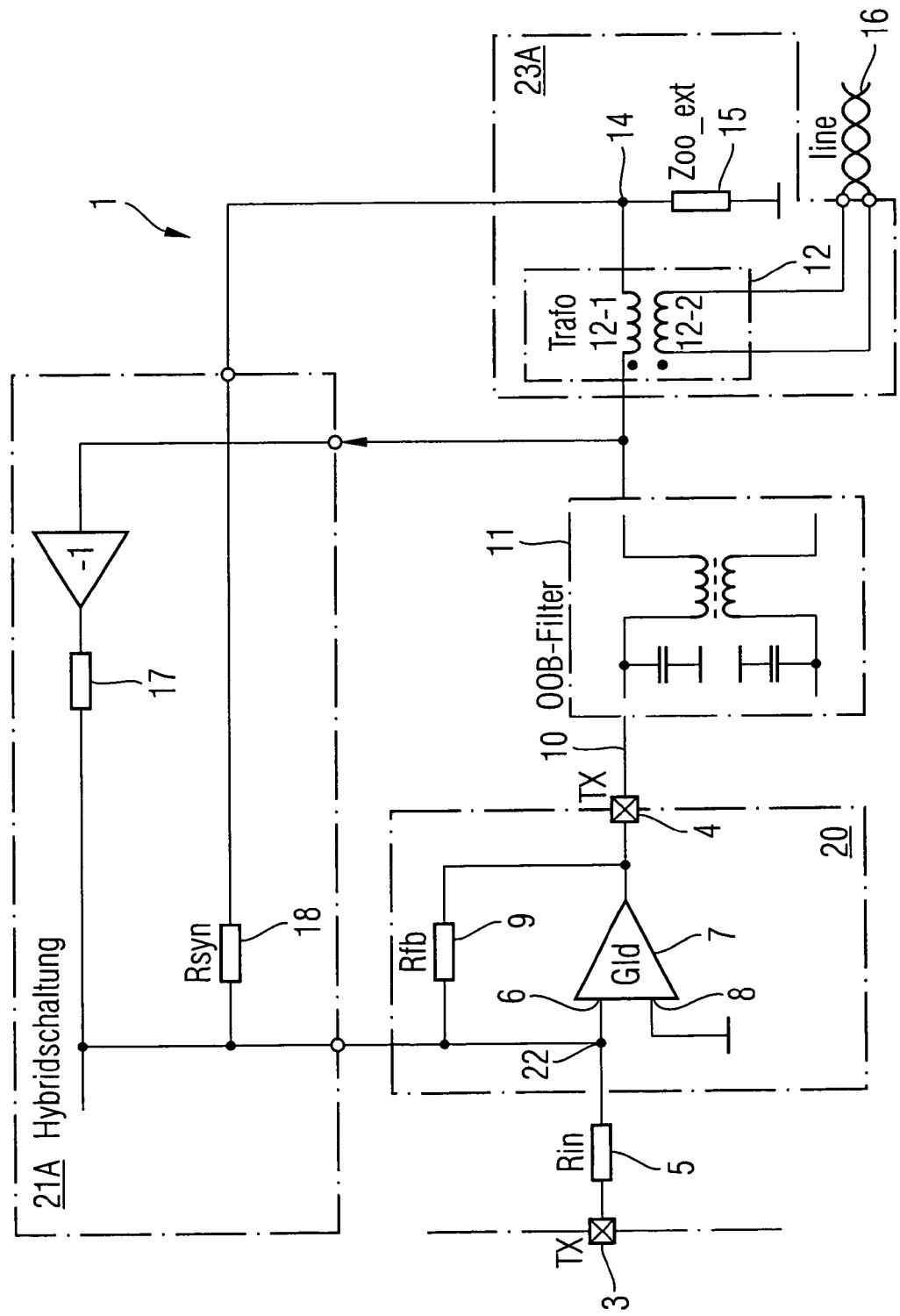
FIG. 8 shows a further embodiment of the driver circuit according to the invention.

FIG. 8 shows a further embodiment of the driver circuit 1 according to the invention. In the driver circuit 1 shown in FIG. 8, a signal amplifier 20 comprises only one feedback impedance 9 whereas the feedback impedance 18, together with the feedback impedance 17 and the preceding inverter, form a hybrid circuit 21. The hybrid circuit 21A couples out a received signal received via the line 16 for further signal processing. The received signal is fed into the transmit signal path at a summation node 22, i.e. is added to the transmit signal to be amplified as shown in FIG. 8. Using the hybrid circuit 21, an impedance synthesis is produced, the synthesized impedance being adjustable independently of the gain of the signal amplifier 20. In an alternative embodiment, two hybrid circuits can also be provided, a first hybrid circuit being provided for coupling out the received signal and the other hybrid circuit being provided for the impedance synthesis. In the embodiment shown in FIG. 8, the hybrid circuit 21A is used both for impedance synthesis and for coupling out the received signal. In the embodiment shown in FIG. 8, a filter 11 is provided between the signal amplifier 20 and a line interface circuit 23A which is formed by the transformer 12 and the terminating impedance 15. The filter 11 is preferably an out-of-band filter and is used for filtering high-frequency signal disturbances of the amplified transmit signal. In a preferred embodiment, the ratio of the impedance values of the two feedback impedances 17, 18 contained in the hybrid circuit 21A is set in such a manner that the gain of the signal amplifier 20 is independent of the filter transfer function H(f) of the filter 11. The signal amplifier 20 is preferably a class-D signal amplifier which delivers a pulse-width-modulator transmit signal, the filter 11 filtering out a high-frequency switching noise of the pulse-width-modulated amplifier transmit signal.

Figure 9:
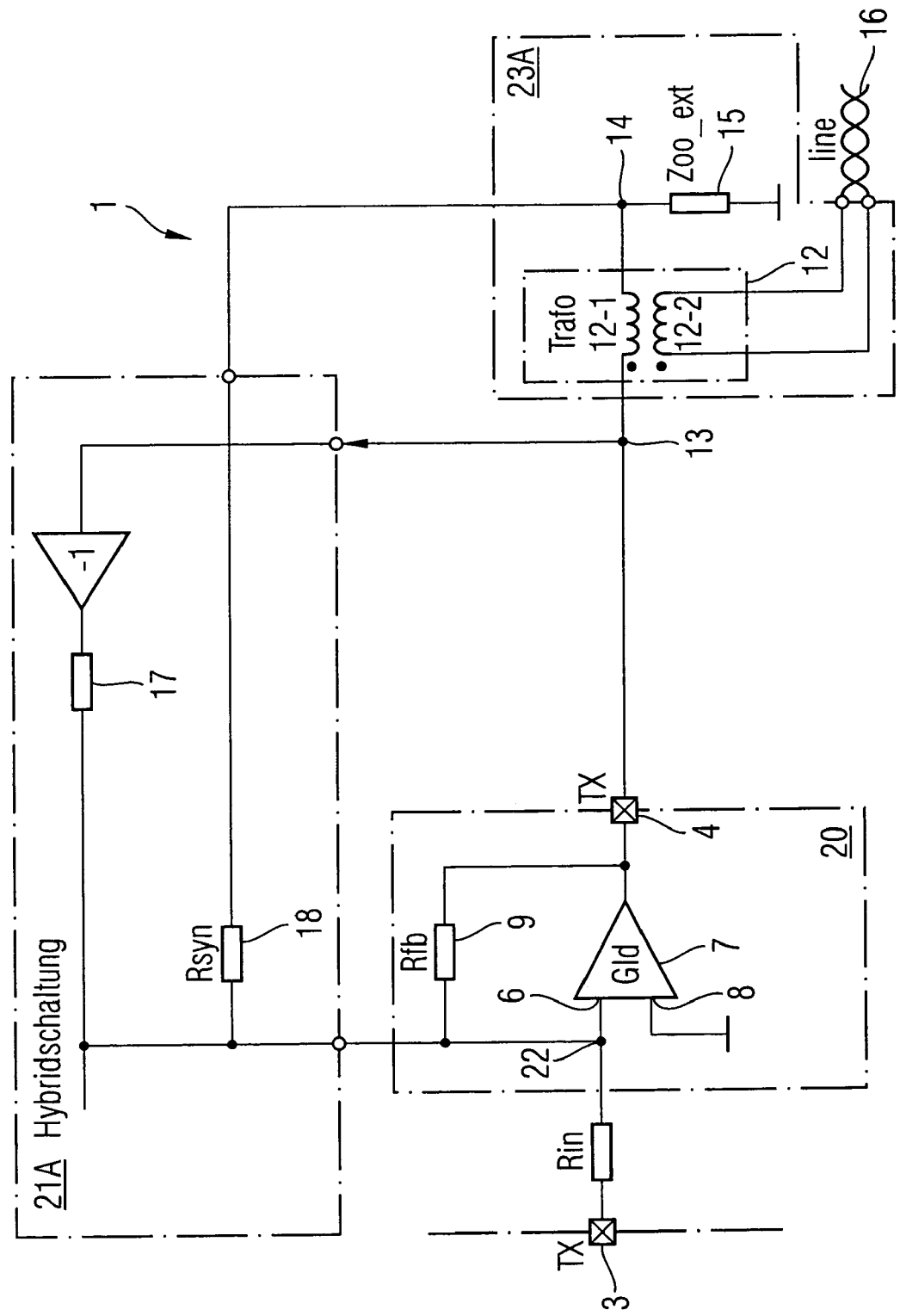
FIG. 9 shows a further embodiment of the driver circuit according to the invention.

FIG. 9 shows an alternative embodiment of the driver circuit 1 according to the invention, in which the filter 11 is not provided, and the signal output 4 of the signal amplifier 20 is connected directly to the first terminal 13 of the primary winding 12-1 of the transformer 12.

Figure 10:
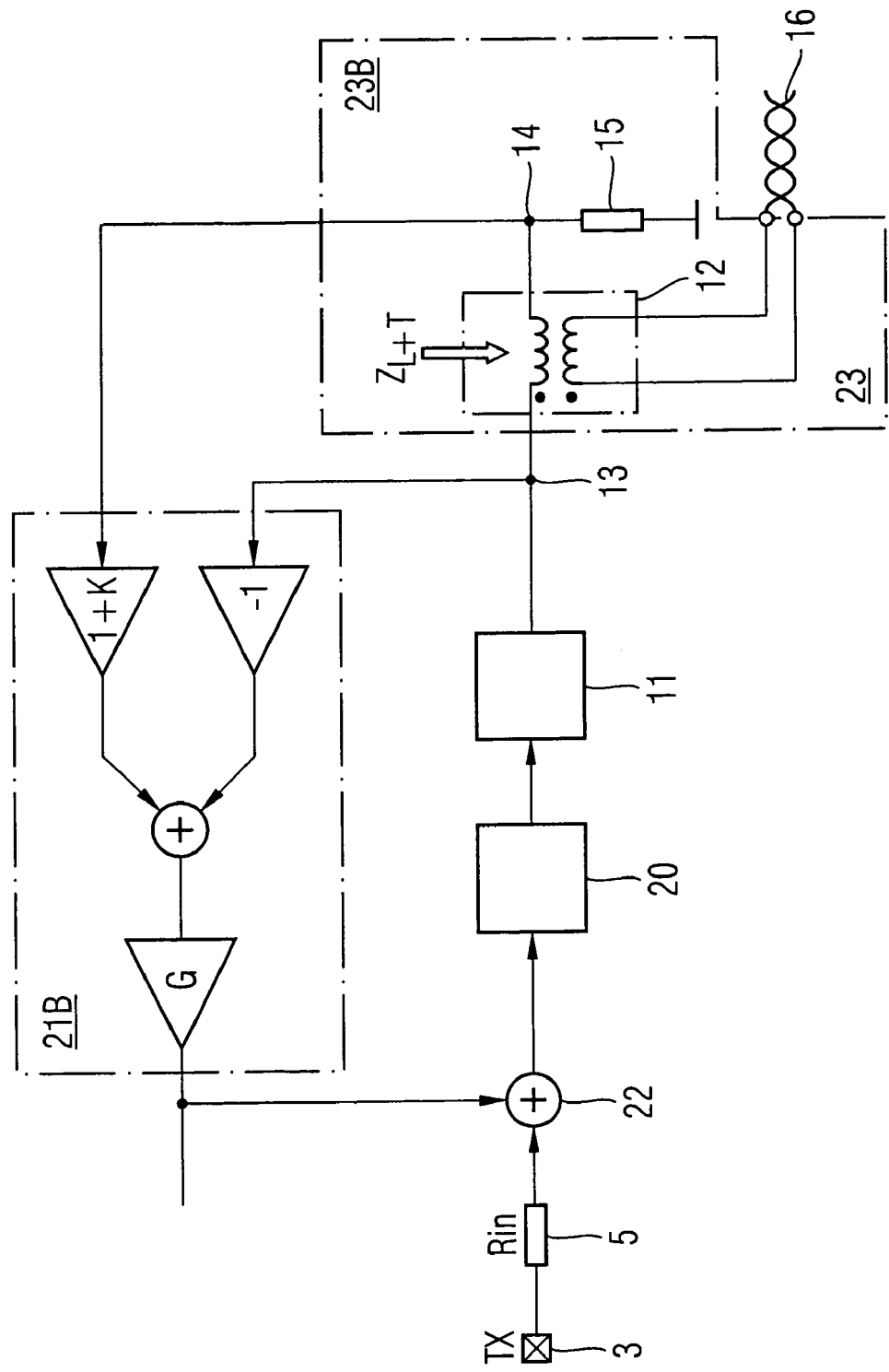
FIG. 10 shows a further embodiment of the driver circuit according to the invention.

FIG. 10 shows a further embodiment of the driver circuit 1 according to the invention with an alternative hybrid circuit 21B. As seen from the primary winding of the transformer 12, there is a complex impedance $Z_{L+T}$ ($Z_{Line+Transformer}$) composed of the line 16 and the transformer 12. The impedance of the terminating impedance 15 is $$\frac{Z_{LT+T}}{k},$$

in the embodiment shown in FIG. 10, where k is a real number. In a preferred range of values, the real number k is $3.2 \leq k \leq 6.0$. The hybrid circuit 21B is connected to the first terminal 13 and to the second terminal 14 of the primary winding 12-1 of the transformer 12. The hybrid circuit 21B has an inverting amplifier, the input of which is connected to the first terminal 13, and a second amplifier which is connected to the second terminal 14 and the gain of which is 1+k. The output signals of the two signal amplifiers contained in the hybrid circuit 21B are added and supplied to a further signal amplifier which delivers the signal amplified with a gain factor G. The signal coupled out of the hybrid circuit 21B is also supplied to a summation node 22 and added to the transmit signal before the signal input of the signal amplifier 20.

Figure 11:
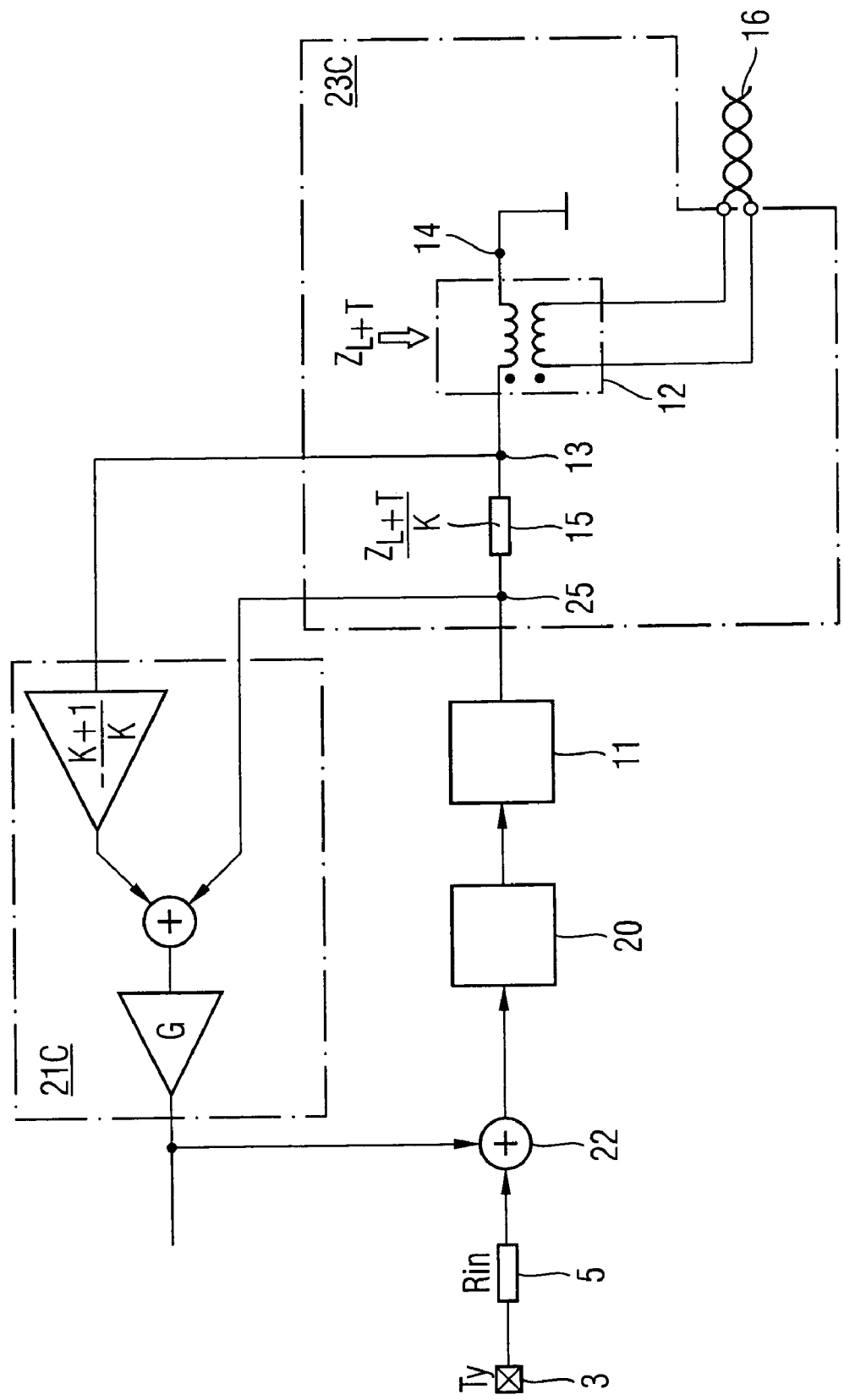
FIG. 11 shows a further embodiment of the driver circuit according to the invention.

FIG. 11 shows a further embodiment of the driver circuit 1 according to the invention. In the embodiment shown in FIG. 11, the complex terminating impedance 15, the impedance of which is $$Z_{\frac{LT+T}{k}},$$

is connected between the signal amplifier 20 and the primary winding 12-1 of the transformer 12. The filter 11 shown in FIG. 11 is not provided in an alternative embodiment so that the signal output of the signal amplifier 20 is connected directly to the terminating impedance 15. The tap for a hybrid circuit 21C is made between the first terminal 13 of the primary winding 12-1 of the transformer 12 and a node 25. The signal picked up at the node 13 is delivered by a signal amplifier with the gain $$-\frac{k+1}{k}$$

to a summation node provided in the hybrid circuit 21C and added to the signal branched off at the branching node 25. The sum signal is amplified at a further signal amplifier G and applied to the summation node 22.

Figure 12:
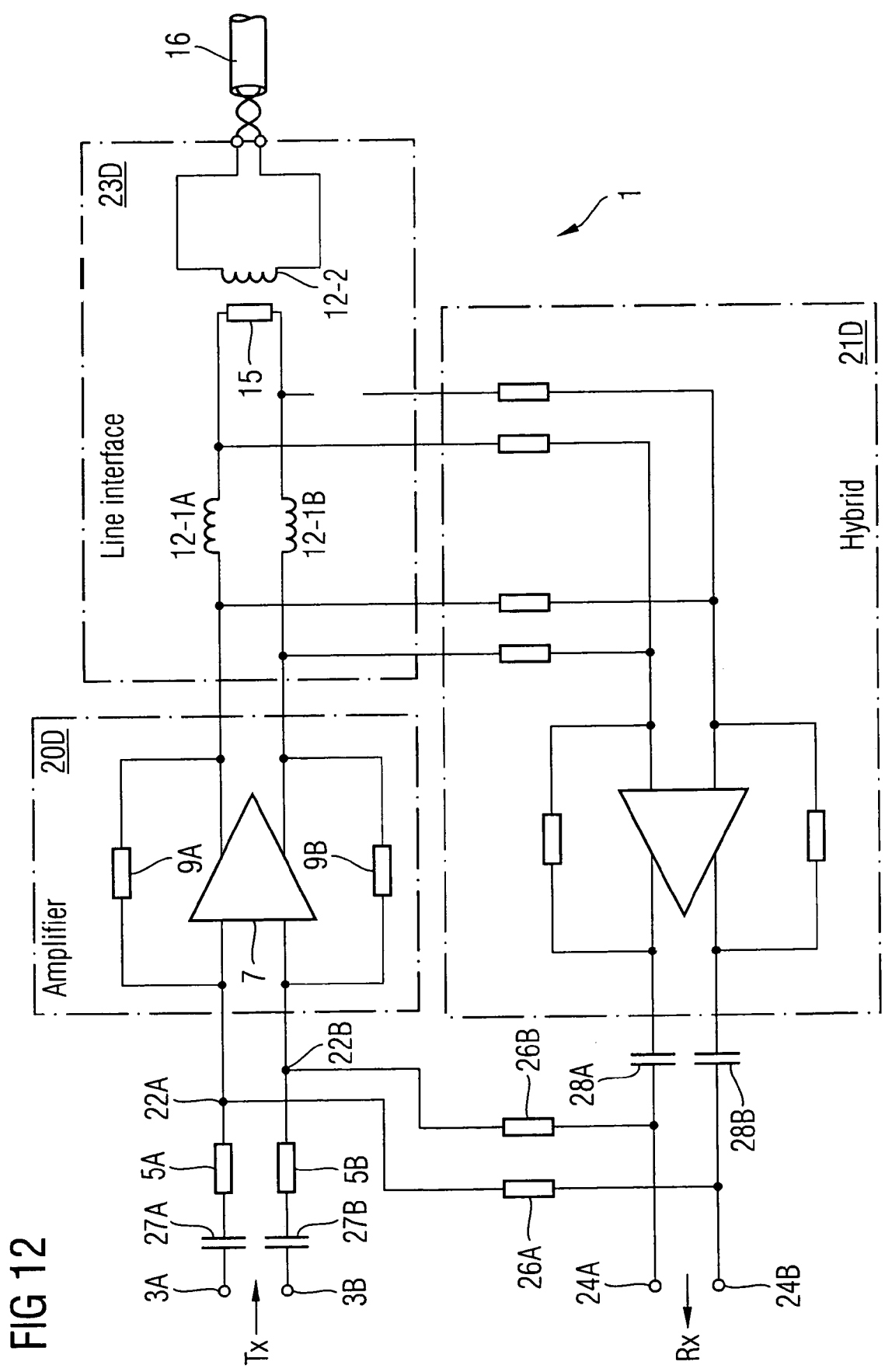
FIG. 12 shows a further embodiment of the driver circuit according to the invention.

FIG. 12 shows a further embodiment of the driver circuit 1 according to the invention. The embodiment shown in FIG. 12 is of fully differential construction and has a fully differential hybrid circuit 21D for coupling out the received signal received via the line 16 to a signal output 24a, 24b. In addition, the hybrid circuit 21D is used for producing an impedance synthesis, wherein the gain of the fully differential signal amplifier 200 can be adjusted independently of the synthesized impedance. This is achieved by feeding back the signal coupled out to the input side of the signal amplifier 200 via resistors 26a, 26b at summation nodes 22a, 22b. Furthermore, FIG. 12 shows the coupling capacitors 27a, 27b, 28a, 28b present at the signal input 3a, 3b and at a signal output 24a, 24b.

The invention claimed is:

1. A driver circuit for driving a transmit signal for a line, comprising:
    (a) a signal amplifier which delivers a transmit signal, present at a signal input of the signal amplifier, amplified with a gain to a signal output;
    (b) a transformer, a secondary winding of which can be coupled to the line and a primary winding of which has a first terminal that is connected to the signal output of the signal amplifier and a second terminal that is connected to a terminating impedance; and
    (c) at least one hybrid circuit which has a first feedback impedance which feeds back the first connection of the primary winding to the signal input of the signal amplifier and has a second feedback impedance which feeds back the second connection of the primary winding to the signal input of the signal amplifier.

2. A driver circuit according to claim 1, wherein a received signal received via the line is coupled out by the hybrid circuit.

3. A driver circuit according to claim 2, wherein the received signal coupled out by the hybrid circuit is added to the transmit signal at a summation node for the purpose of impedance synthesis.

4. A driver circuit according to claim 3, wherein the synthesized impedance can be adjusted independently of the gain of the signal amplifier.

5. A driver circuit according to claim 1, wherein a filter for filtering high-frequency signal disturbances of the amplified transmit signal is provided between the signal amplifier and the transformer.

6. A driver circuit according to claim 5, wherein the ratio of impedance values of the two feedback impedances contained in the hybrid circuit is such that the gain is independent of a filter transfer function of the filter.

7. A driver circuit according to claim 5, wherein the filter is an out-of-band filter.

8. A driver circuit according to claim 1, wherein the signal amplifier is a class-D signal amplifier which delivers a pulse-width-modulated transmit signal.

9. A driver circuit according to claim 7, wherein the filter is an analogue low-pass filter which filters a high-frequency switching noise of the pulse-width-modulated amplified transmit signal.

10. A driver circuit according to claim 1, wherein the feedback impedances are formed by resistors.

11. A driver circuit according to claim 1, wherein the driver circuit is of differential construction.

12. A driver circuit according to claim 1, wherein the line is a telephone line.

13. A driver circuit for driving a transmit signal for a telephone line, comprising:
    (a) a signal amplifier which amplifies a transmit signal, present at a signal input of the signal amplifier, with a gain and delivers it to a signal output;
    (b) a filter which filters high-frequency signal disturbances of the amplified transmit signal in accordance with a filter transfer function;
    (c) a transformer, the secondary winding of which can be coupled to the telephone line and the primary winding of which has a first terminal which is connected to the filter and a second terminal which is connected to a terminating impedance;
    (d) a first feedback loop which feeds back the first connection of the primary winding to the signal input of the signal amplifier via a first feedback resistor;
    (e) a second feedback loop which feeds back the second connection of the primary winding to the signal input of the signal amplifier via a second feedback impedance;
    (f) wherein the ratio of the resistance values of the two feedback impedances is such that the gain is independent of the filter transfer function of the filter.

14. A driver circuit according to claim 13, characterized in that the signal amplifier is a class-D signal amplifier which delivers a pulse-width-modulated transmit signal.

15. A driver circuit according to claim 14, characterized in that the filter is an analogue low-pass filter which filters a high-frequency switching noise of the pulse-width-modulated amplified transmit signal.

16. A driver circuit according to claim 13, characterized in that the feedback impedances are formed by resistors.

17. A driver circuit according to claim 13, characterized in that the second feedback loop generates a synthesized line terminating impedance.

18. A driver circuit according to claim 13, characterized in that the driver circuit is of differential construction.

19. A hybrid circuit for a transceiver which couples out a received signal received via a line and adds it to a transmit signal of the transceiver at a summation node for the purpose of impedance synthesis of an output impedance of the transceiver.

20. A driver circuit for driving a transmit signal for a line, comprising:
 (a) a signal amplifier which delivers a transmit signal, present at a signal input of the signal amplifier, amplified with a gain to a signal output;
 (b) a line interface circuit which is connected between the signal output of the signal amplifier and the line, the interface circuit at least including a transformer and a terminating impedance, the transformer having at least one terminal coupled to the terminating impedance; and
 (c) a hybrid circuit which is connected to the line interface circuit, wherein the hybrid circuit suppresses the transmit signal and couples a received signal received via the line to a signal input of the signal amplifier for the purpose of impedance synthesis.

21. A method for driving a transmit signal, in which a transmit signal is amplified and coupled into a line, wherein a received signal received via the line is coupled out and added to the transmit signal for the purpose of impedance synthesis.

* * * * *